US009172035B2

(12) United States Patent
Pickett et al.

(10) Patent No.: US 9,172,035 B2
(45) Date of Patent: Oct. 27, 2015

(54) MEMRISTORS AND METHODS OF FABRICATION

(75) Inventors: Matthew Pickett, San Francisco, CA (US); Janice Nickel, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 14/357,783

(22) PCT Filed: Dec. 12, 2011

(86) PCT No.: PCT/US2011/064429
§ 371 (c)(1),
(2), (4) Date: May 13, 2014

(87) PCT Pub. No.: WO2013/089666
PCT Pub. Date: Jun. 20, 2013

(65) Prior Publication Data
US 2014/0312292 A1    Oct. 23, 2014

(51) Int. Cl.
*H01L 45/00* (2006.01)
*H01L 49/02* (2006.01)
*H01L 27/24* (2006.01)

(52) U.S. Cl.
CPC .......... *H01L 45/1233* (2013.01); *H01L 28/24* (2013.01); *H01L 45/04* (2013.01); *H01L 45/146* (2013.01); *H01L 45/1608* (2013.01); *H01L 45/1633* (2013.01); *H01L 45/1683* (2013.01); *H01L 27/2463* (2013.01)

(58) Field of Classification Search
CPC .................................................. H01L 45/1633
See application file for complete search history.

(56) References Cited

U.S. PATENT DOCUMENTS

| 2009/0053538 | A1  | 2/2009 | Ma et al. |
| 2011/0068316 | A1  | 3/2011 | Takano et al. |
| 2011/0163449 | A1  | 7/2011 | Kelly et al. |
| 2011/0182103 | A1  | 7/2011 | Smythe et al. |
| 2012/0146223 | A1* | 6/2012 | Zhao et al. ............. 257/751 |

FOREIGN PATENT DOCUMENTS

| JP | 2007220768 A | 8/2007 |
| JP | 2010503195   | 1/2010 |

(Continued)

OTHER PUBLICATIONS

International Search Report & Written Opinion, Aug. 7, 2012, PCT Application No. PCT/US2011/064429, 10 pages.

(Continued)

*Primary Examiner* — Stephen W Smoot
(74) *Attorney, Agent, or Firm* — Hewlett-Packard Patent Department

(57) ABSTRACT

Memristors and their fabrication are provided. A first dielectric layer is formed over one or more conductive pathways. Vias are formed in the dielectric layer and filled with conductive material. A second dielectric layer is formed there over, and vias are formed aligned with and extending to the filled vias. A reactant fluid is introduced into the vias such that a reacted portion of the conductive material is defined within the filled vias. The vias in the second dielectric layer are then filled with conductive material such that memristors are defined. Conductive pathways are then formed over and in contact with the memristors such that each is individually addressable.

15 Claims, 5 Drawing Sheets

(56) References Cited

FOREIGN PATENT DOCUMENTS

| WO | WO2011/008767 | 1/2011 |
| WO | WO2011/149505 | 12/2011 |

OTHER PUBLICATIONS

Extended European Search Report, Mar. 23, 2015, European Patent Application No. 11877460.3, 6 pages.

* cited by examiner

MEMRISTORS AND METHODS OF FABRICATION

CROSS-REFERENCE TO RELATED APPLICATION

This application is a U.S. National Stage Application of and claims priority to International Patent Application No. PCT/US2011/064429, filed on Dec. 12, 2011, and entitled "MEMRISTORS AND METHODS OF FABRICATION".

BACKGROUND

A memristor is a device characterized by a non-volatile electrical resistance that is adjustable over a range. The present electrical resistance value of a memristor can be sensed with little or no change once it has been established. Various devices can be constructed using memristors and arrays thereof.

However, known memristor construction techniques sometimes yield undesirable stoichiometric ratios, exhibit unintended oxidation, reduction or other chemical species contamination, suffer damage caused by etching or other fabrication processes, and so on. Additionally, portions of a memristor device are sometimes misaligned as a result of known fabrication processes. The present teachings address the foregoing and other concerns.

BRIEF DESCRIPTION OF THE DRAWINGS

The present embodiments will now be described, by way of example, with reference to the accompanying drawings, in which.

DETAILED DESCRIPTION

Introduction

Methods and devices related to memristors are provided. Memristors and their fabrication are provided. A first dielectric layer is formed over one or more conductive pathways. Vias are then formed in the dielectric layer and filled with conductive material. A second dielectric layer is formed thereover, and respective vias are formed that are aligned with and extending to the filled vias. A reactant fluid is then introduced into the vias such that a reacted portion of the conductive material is defined within the filled vias.

The vias in the second dielectric layer are then filled with conductive material such that respective memristors are defined. Conductive pathways are then formed over and in contact with the memristors such that each is individually addressable. Such memristors can be formed over and/or electrically coupled to CMOS or other circuitry on single wafer or common substrate.

In one example, a method includes defining a first via in a first dielectric layer, and forming a first conductive material within the first via. The method also includes forming a second dielectric layer over the first dielectric layer, and defining a second via in the second dielectric layer aligned within the first via and leading to the first conductive material. The method additionally includes reacting a portion of the first conductive material with at least one fluid species by way of the second via. The method further includes forming a second conductive material within the second via in electrical contact with the reacted portion of the first conductive material.

In another example, a device includes a first conductive material formed within a first via of a first dielectric layer. A portion of the first conductive material has been reacted with at least one species thus defining a reacted portion. The device also includes a second conductive material formed within a second via of a second dielectric layer disposed over the first dielectric layer. The second conductive material is in contact with the reacted portion. The first conductive material and the reacted portion and the second conductive material define a memristor that is characterized by a non-volatile electrical resistance.

First Illustrative System

Reference is now made to FIGS. 1A-1G, which collectively depict a sequence of fabricating a plurality of memristor devices. The sequence of FIGS. 1A-1G is illustrative and non-limiting in nature. Thus, other sequences, methods, devices, and systems are contemplated by the present teachings.

Figure 1A:
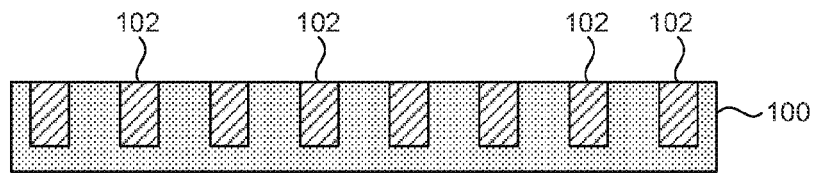
FIGS. 1A-1G collectively depicts a sequence of fabricating memristors according to one example of the present teachings.

FIG. 1A depicts a base dielectric material 100. Non-limiting examples of the base dielectric material 100 include silicon, silicon dioxide, silicon nitride or silicon carbide. Other suitable, electrically non-conductive materials can also be used. A plurality of conductive pathways 102 are formed in and supported in place by the dielectric material 100. Each of the conductive pathways 102 can be formed from metal or another suitable, electrically conductive material. In one example, the conductive pathways 102 are formed from copper. Other materials such as, without limitation, aluminum or tungsten, can also be used. The conductive pathways 102 can be formed by way of a damascene process. Alternatively, a metal layer can be formed and then etched to define the conductive pathways 102, after which a dielectric fill material is provided between them. Other suitable fabrication techniques can also be used.

The base dielectric layer 100 and subsequent layers described below can be formed or defined over one or more other material layers. In one example, the base dielectric layer 100 is formed over complimentary metal-oxide semiconductor (CMOS) circuitry. Thus, CMOS or other circuitry and memristor devices according to the present teachings can be formed on a single wafer or common substrate. Additionally, memristor devices contemplated herein can be electrically coupled to such underlying CMOS (or other) circuitry and cooperative therewith.

Figure 1B:
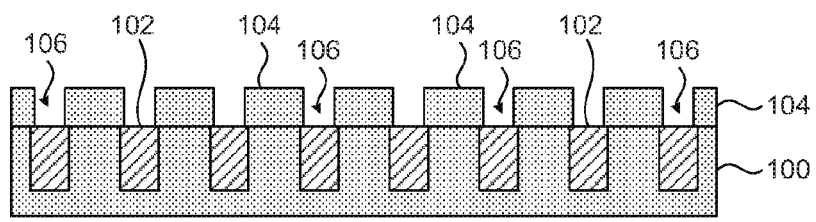

FIG. 1B depicts a dielectric layer 104 formed or deposited over the base dielectric material 100 and the respective conductive pathways 102. Additionally, the dielectric layer 104 has been processed by photolithography and etching so as to define a plurality of vias 106. Each via 106 extends through a thickness aspect of the dielectric layer 104 to respective one of the conductive pathways 102.

In one example, the dielectric layer 104 is formed from the same material as the base dielectric material 100. Other suitable non-conductive materials can also be used. Each via 106 can be defined, for non-limiting example, by a round cross-sectional area, constant or tapered, such that a cylindrical or truncated cone-like void is defined. Other suitable geometries or form-factors can also be used.

Figure 1C:
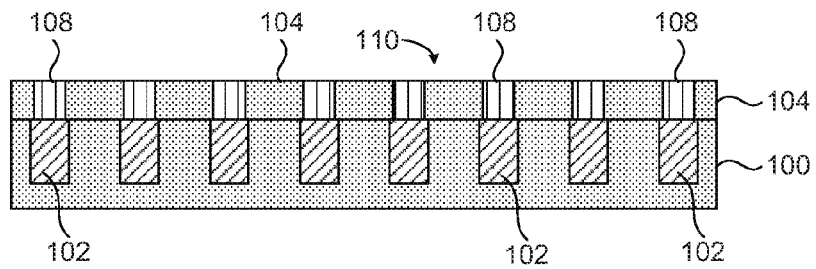

FIG. 1C depicts a conductive material 108 formed or deposited into each of the respective vias 106. Thus, each via 106 is now filled with the conductive material 108. Non-limiting examples of the conductive material 108 include: tantalum (Ta), tantalum nitride ($TaN_x$), tantalum oxide ($TaO_x$), titanium (Ti), titanium nitride ($TiN_x$), titanium oxide ($TiO_x$), hafnium (Hf), hafnium nitride ($HfN_x$), hafnium oxide ($HfO_x$), tungsten (W), tungsten nitride ($WN_x$), and tungsten oxide ($WO_x$). Other conductive materials, or compounds including two or more suitable materials, can also be used. The respective portions of the conductive material 108 and the surrounding dielectric layer 104 are polished no as to define a planar surface 110.

Figure 1D:
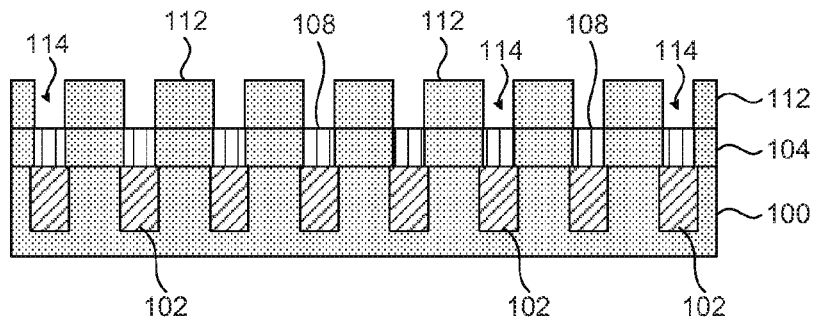

FIG. 1D depicts a dielectric layer 112 formed or deposited over the dielectric layer 104 and the respective portions of conductive material 108. The dielectric layer 112 has been processed by photolithography and etching so as to define a plurality of via 114. Each via 114 extends through a thickness aspect of the dielectric layer 112 to a respective one of the portions of conductive material 108. Each via 114 can be defined, for non-limiting example, by any suitable form-factor (cylindrical, truncated cone, and so on). Furthermore, each via 114 is aligned with a corresponding (filled) via 106. In one example, the same photolithographic mask is used to define the vias 106 and the vias 114.

Figure 1E:
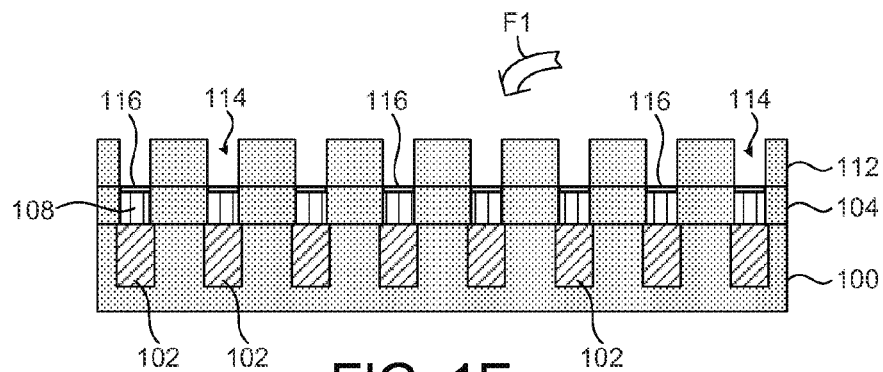

FIG. 1E depicts a reactant fluid F1 that is provided or introduced into the respective vias 114. As used herein, the terms "fluid" and "reactive fluid" can include a gas, liquid or plasma phase reactant, or some combination of these that include one or more reactive species. In general, a "fluid" is defined by matter that cannot maintain a shear stress, and includes the gas, liquid and/or plasma phases of matter.

The fluid F1 can include, for non-limiting example, oxygen ($O_x$), nitrogen ($N_x$), sulfur (S), carbon (C), boron (B), or phosphorus (P), or combinations of two or more of these or other respective species. The fluid F1 reacts with the exposed portions of the conductive material 108 such that respective reacted portions 116 are defined. Thus, each via 106 includes a reacted portion 116 and an un-reacted (i.e., unchanged) portion of the conductive material 108.

Figure 1F:
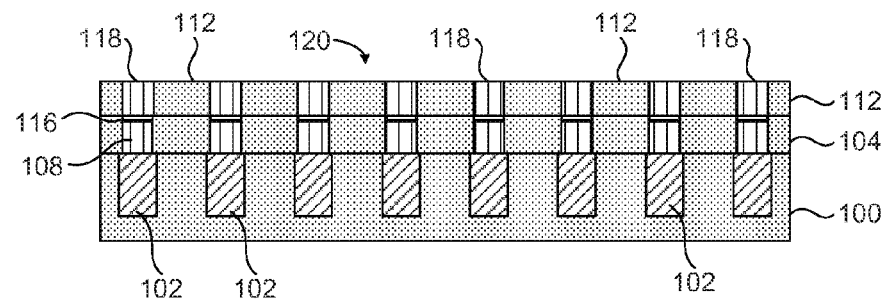

FIG. 1F depicts a conductive material 118 formed or deposited into each of the respective vias 114. Each via 114 is therefore filled with the conductive material 118. In turn, each portion of conductive material 118 is in contact with a corresponding reacted portion 116. Non-limiting examples of the conductive material 118 include any of those described above with respect to the conductive material 108. Other conductive materials, or compounds including two or more suitable materials, can also be used. The respective portions of conductive material 118 and the surrounding dielectric layer 112 are polished so as to define a planar surface 120.

Figure 1G:
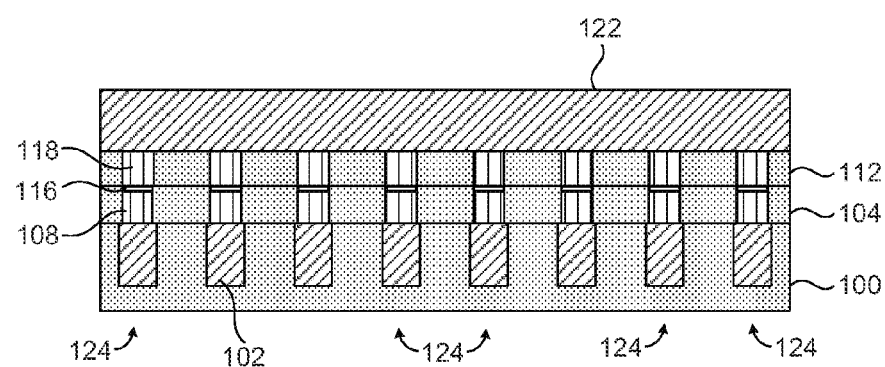

FIG. 1G depicts a conductive pathway 122 formed over the dielectric layer 112 and in electrically conductive contact with each of the respective portions of conductive material 118. The conductive pathway 122 can be formed from any suitable electrically conductive material such as copper, aluminum, tungsten, and so on. Other suitable, electrically-conductive materials can also be used.

A plurality of respective memristors 124 are each defined by a portion of conductive material 118, a corresponding reacted portion 116 and a portion of conductive material 108. A total of eight memristors 124 are depicted in the interest of clarity and simplicity. However, fabrication and use of any suitable number of memristors is contemplated by the present teachings. Each memristor 124 is in electrical contact with a corresponding one of the conductive pathways 102 and the conductive pathway 122. Thus, the memristors 124 can be individually addressed (i.e., accessed, read or adjusted) by way of a corresponding conductive pathway 102 and the conductive pathway 122.

Illustrative Memristors

Figure 2:
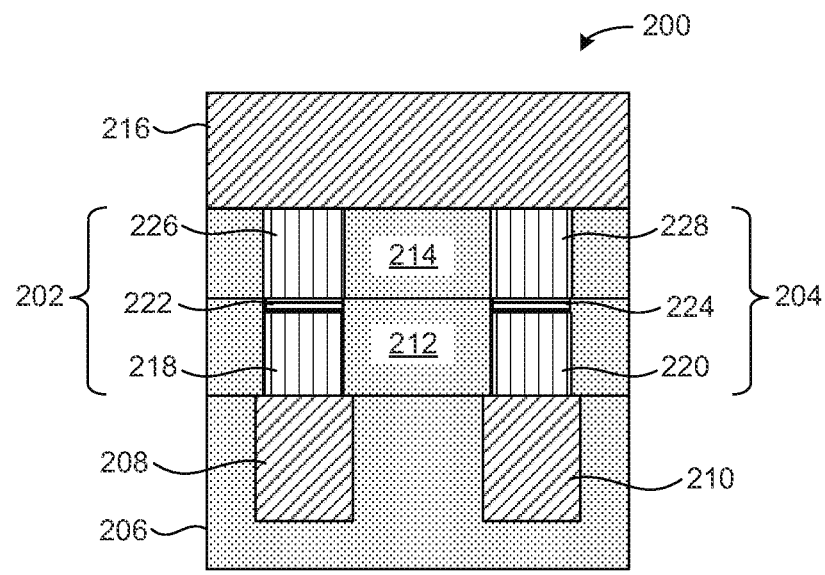
FIG. 2 depicts a construct including two memristors fabricated in accordance with another example.

Attention is now directed to FIG. 2, which depicts a construct 200 including a pair of memristors 202 and 204, respectively. The construct 200 is illustrative and non-limiting with respect to the present teachings. Other constructions, memristors, devices and systems can also be formed and used.

The construct 200 includes a base dielectric material 206. The base material can be defined, for example, by silicon oxide, silicon nitride, silicon carbide or other insulating compounds such as metal oxides. Other suitable materials can also be used. The construct 200 also includes conductive pathways or buss-bars 208 and 210, respectively. Each of the conductive pathways 208 and 210 can be formed from any suitable electrically-conductive materials such as copper, aluminum, and so on. Other materials can also be used. The conductive pathways 208 and 210 are understood to be formed within the base dielectric material 206 by way of a damascene process. Other suitable fabrication techniques can also be used.

The construct 200 also includes a dielectric layer 212 and a dielectric layer 214. Each of the respective dielectric layers 212 and 214 can be formed from the same material as the base dielectric layer 206, or from one or more different dielectric materials. The construct 200 further includes a conductive pathway or buss-bar 216. The conductive pathway 216 can be formed from any suitable electrically conductive material and is supported in overlying relationship with the dielectric layer 214.

The memristor 202 includes a first conductive material 218 supported within a via defined by (or within) the dielectric layer 212. In turn, the memristor 204 is defined by or includes a first conductive material 220 supported within a via defined by the dielectric layer 212. In one example, the respective vies are formed by single-mask photolithography and etching techniques. Other suitable fabrication techniques can also be used. Each of the quantities of conductive material 218 and 220 can be defined by or include any one or more of those described above with respect to the conductive material 108. Other conductive materials can also be used.

The memristors 202 and 204 also include reacted portions 222 and 224 of the first conductive materials 218 and 220, respectively. The reacted portions 222 and 224 are formed by introducing a reactive fluid into respective vias formed in the dielectric layer 214. Such vies in the dielectric layer 214 can be formed by photolithography and etching techniques. Other suitable fabrication techniques can also be used. The fluid can be defined by or include any suitable elemental species such as those described above in regard to fluid F1.

The memristor 202 further includes a second conductive material 226 supported within a via defined by the dielectric layer 214. Similarly, the memristor 204 includes a second conductive material 228 supported within a corresponding via defined by the dielectric layer 214. In one example, the respective vias are formed by single-mask photolithography and etching techniques. Other suitable fabrication techniques can also be used. Each of the quantities of conductive material 226 and 228 can be defined by or include any one or more of those described above with respect to the conductive material 108. Other conductive materials can also be used.

The memristor 202 is thus defined by the first conductive material 218 and the reacted portion 222 and the second conductive material 226, being connected in series-circuit arrangement between the conductive pathways 208 and 216, respectively. The memristor 202 is accessible (i.e., readable or adjustable) using electrical signaling by way of the conductive pathways 208 and 216.

In turn, the memristor 204 is defined by the first conductive material 220 and the reacted portion 224 and the second conductive material 228, being connected in series-circuit arrangement between the conductive pathways 210 and 216, respectively. The memristor 204 is therefore accessible using electrical signaling by way of the conductive pathways 210 and 216. The memristors 202 and 204 of the construct 200 are fabricated, essentially, in accordance with the sequence depicted by FIGS. 1A-1G and as described above.

Alignment of the respective vias and the conductive materials formed therein is essentially assured because the same single mask is used during photolithography of each of the dielectric layers 212 and 214. Additionally, the reacted portions 222 and 224 are not subjected to etching chemistry or atmospheric or other contaminants because the second conductive materials 226 and 228, respectively, are formed in direct contact therewith. The present teachings contemplate memristor fabrication using reduced masking requirements and resulting in formations of improved alignment and material purity relative to known techniques.

Illustrative Memristor Array

Figure 3:
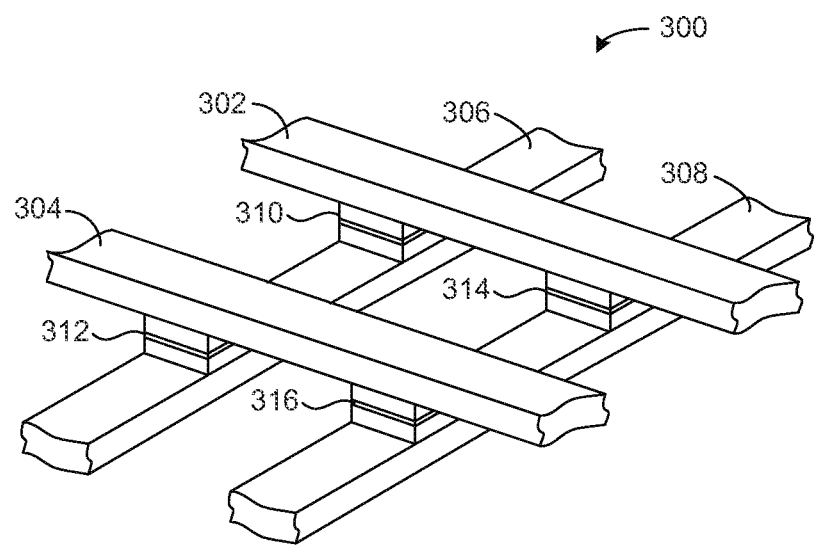
FIG. 3 depicts an array of memristors according to another example.

Attention is now directed to FIG. 3, which depicts an isometric view of a two-by-two array 300. The array 300 is illustrative and non-limiting, and includes elements fabricated in accordance with the present teachings. Thus, other arrays and networks can be configured, constructed or operated in accordance with the present teachings. As depicted, the array 300 omits base, first and second layers of dielectric material (e.g., 206, 212 and 214, respectively) in the interest of clarity. However, it is to be understood that memristors and arrays according to the present teachings include such respective layers of dielectric material.

The array 300 includes a first conductive pathway 302, a second conductive pathway 304, a third conductive pathway 306 and a fourth conductive pathway 308. Each of the respective conductive pathways 302-308, inclusive, can be formed from or include any suitable electrically conductive material such as, for non-limiting example, copper, aluminum, tungsten, palladium, hafnium nitride, titanium nitride (TiN), tantalum nitride, ruthenium oxide, etc. Other suitable materials can also be used.

The conductive pathways 302 and 304 are disposed in spaced parallel adjacency. In turn, the conductive pathways 306 and 308 are disposed in spaced parallel adjacency and are generally perpendicular to the conductive pathways 302 and 304. Additionally, the conductive pathways 302 and 304 generally overlie and are spaced apart from the conductive pathways 306 and 308 such that an elevation offset is also defined. Overlying proximity or "cross-over" between any two conductive pathways is referred to as an "intersection" for purposes herein.

The array 300 is also defined by four memristors located at four respective intersections. Specifically, a first memristor 310 is present at an intersection defined by the conductive pathways 302 and 306. A second memristor 312 is located at an intersection defined by conductive pathways 304 and 306. A third memristor 314 is located at an intersection defined by conductive pathways 302 and 308. Furthermore, a fourth memristor 316 is located at an intersection defined by conductive pathways 304 and 308.

Each of the respective memristors 310, 312, 314 and 316 is fabricated and defined according to the present teachings. For example, the memristors 310-316 can be defined and fabricated substantially as described above in regard to the memristors 124.

The array 300 depicts a total of four memristors 310-316 that can be individually accessed (i.e., adjusted or read) by way of the corresponding conductive pathways 302-308. For non-limiting example, the memristor 314 can be adjusted from a first non-volatile resistance value to another non-volatile resistance value by way of an appropriate programming voltage applied across the crossbars 302 and 308. It should be apparent to one of ordinary skill in the electrical arts that other arrays having any suitable number of individually accessible memristors can also be defined and used. Thus, the size of an array can be one-thousand by one-thousand or even larger, or three-dimensional in arrangement, depending on the embodiment, applications, associated circuit design, etc.

Illustrative Device

Figure 4:
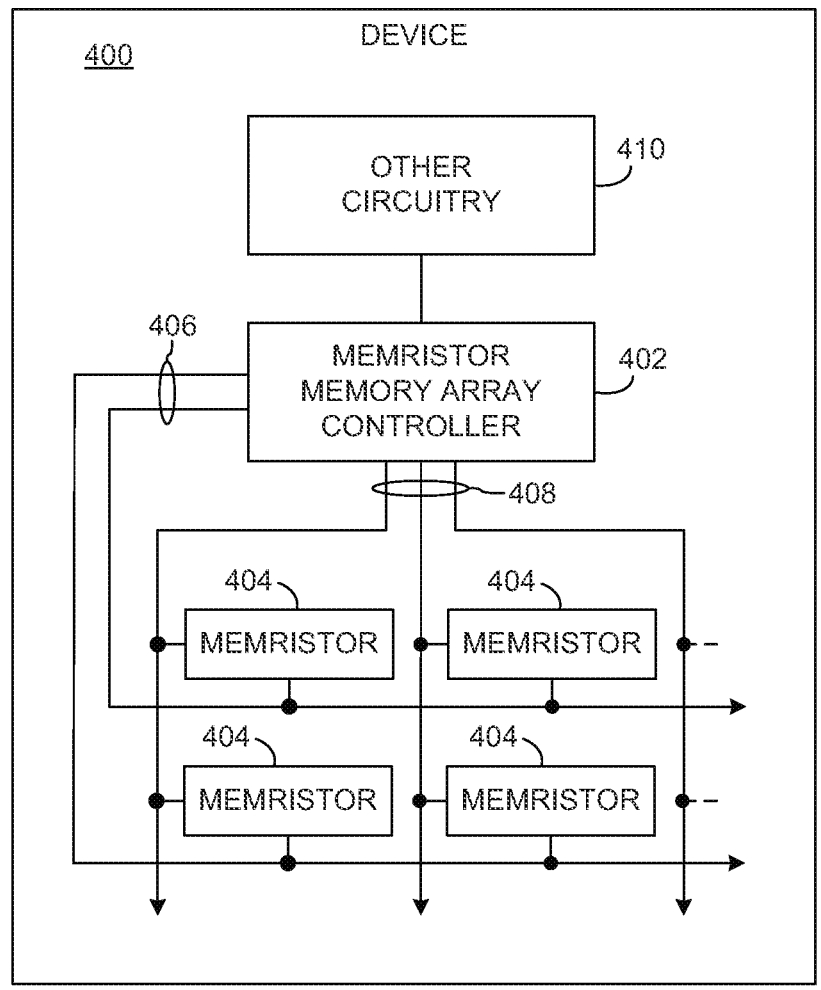
FIG. 4 depicts a block diagram of a device according to another example.

Reference is now made to FIG. 4, which depicts a block diagram of a device 400 according to another embodiment of the present teachings. The device 400 is illustrative and non-limiting in nature. Thus, other devices, circuits and systems are contemplated that include one or more aspects of the present teachings.

The device 400 includes a memristor memory array controller (controller) 402. The controller 402 is configured to address individual memristors 404 of the device 400. Such addressing is performed by way of rove control lines 406 and column control lines 408. The controller 402 is also configured to apply programming voltages to the memristors 404 by way of the controls lines 406 and 408.

The device 400 further includes a plurality of memristors 404. Each memristor 404 is defined, configured and operative in accordance with the present teachings. In one embodiment, one or more of the memristors 404 is/are fabricated as described above with respect to the memristors 124. Other embodiments formed according to the present teachings can also be used.

The memristors 404 are arranged as an X-by-Y array, with each memristor 404 being individually addressable and programmable by the controller 402. Each memristor 404 can be operated as a storage cell representing a digital bit, an analog signal level, etc. In one example, the controller 402 is fabricated on the same wafer as the memristors 404, being positioned below the respective control lines 406 and/or 408.

FIG. 4 depicts a total of four memristors 404 arranged as an array. However, it is to be understood that other arrays including any suitable number of matched or different memristors can also be defined and operated in accordance with the present teachings. Stacking the memristor array depicted in FIG. 4 so as to construct a three dimensional memristor array is also possible.

The device 400 also includes other circuitry 410. The other circuitry 410 can include or be defined by any suitable electronic or electrical circuitry in accordance with the normal function(s) of the device 400. Non-limiting examples of such other circuitry include power conditioning circuits, cellular communications circuitry, microprocessor or microcontrollers, computer network circuitry, and so on. In one example, the other circuitry or a portion thereof is formed on the same wafer or substrate as the memristors 404 or controller 402.

The other circuitry 410 is coupled to receive signals from and send signals to the controller 402. In one non-limiting example, the other circuitry 410 is configured to send digital values to and receive digital values from the controller 402. In turn, the controller 402 stores and retrieves such digital values as binary bits within the memristors 404. Each binary bit is stored by adjusting the non-volatile electrical resistance of a corresponding one of the memristors 404 to a corresponding value within a range. In turn, the binary bits can be read or retrieved from the memristors 404 by appropriate electrical signaling. Other operational schema can also be used.

Illustrative Method

Figure 5:
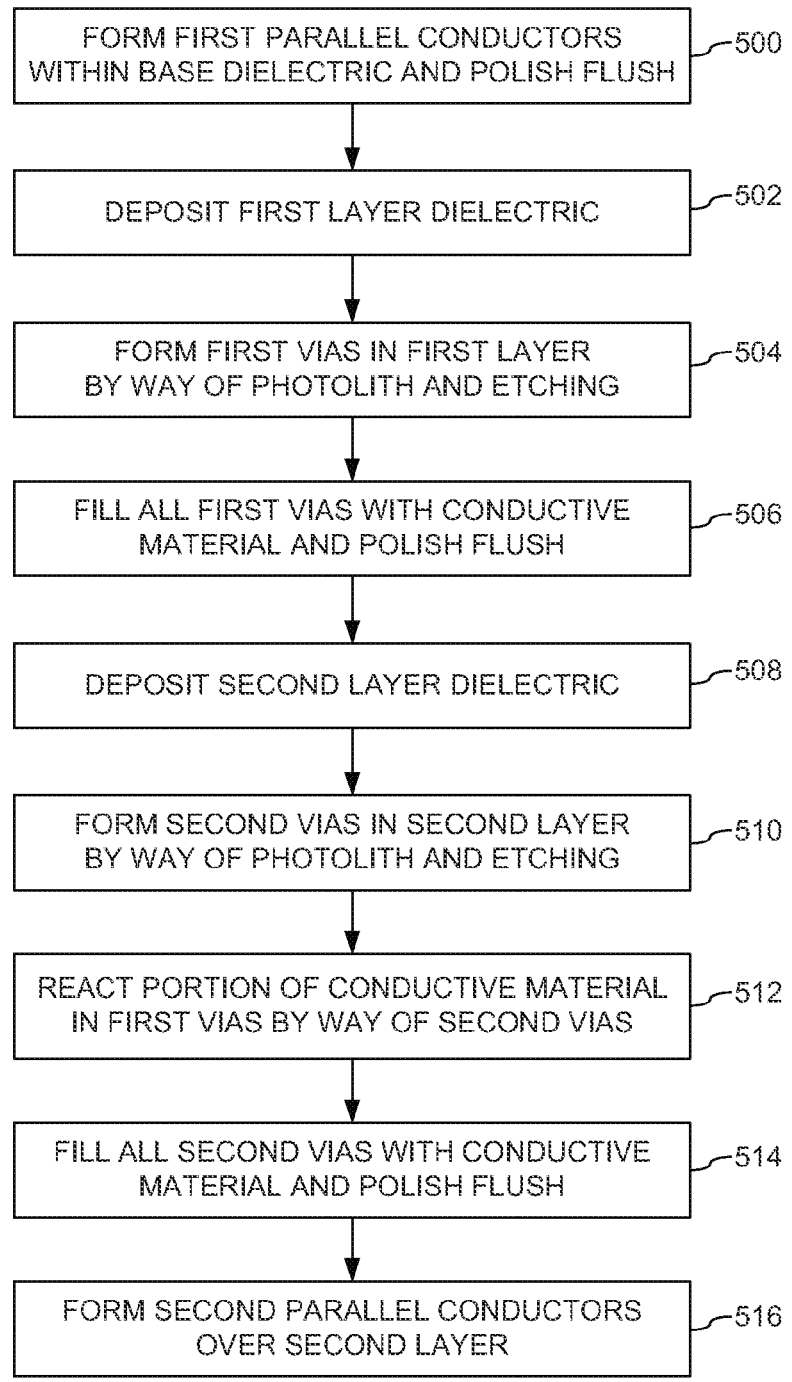
FIG. 5 depicts a flow diagram of a method according to yet another example.

Attention is now directed to FIG. 5, which depicts a flow diagram of a method according to another example of the present teachings. The method of FIG. 5 includes particular steps and proceeds in a particular order of execution. However, it is to be understood that other respective methods including other steps, omitting one or more of the depicted steps, or proceeding in other orders of execution can also be used. Thus, the method of FIG. 5 is illustrative and non-limiting with respect to the present teachings. Reference is also made to FIGS. 1A-1G in the interest of understanding the method of FIG. 5.

At 500, parallel conductors are formed within a base dielectric layer. For purposes of a present example, distinct parallel conductors 102 are formed from copper within a base dielectric material 100. The parallel conductors 102 are formed by way of a damascene process. Additionally, the conductors 102 and the base dielectric layer 100 are polished flush with one another so as to define a planar surface.

At 502, a first dielectric layer is deposited. For purposes of the present example, a layer of dielectric material 104 is formed over the parallel conductors 102 and the base dielectric layer 100.

At 504, first vias are formed in the first dielectric layer by way of photolithography and etching. For purposes of the present example, a photolithographic mask is used to define locations for a plurality of respective vias 106 in the layer of dielectric material 104. The vias 106 are then defined by etching the dielectric material 104. Each of the vias 106 is located in overlying alignment with a corresponding conductor 102. It is noted that any particular conductor 102 can have any suitable number of vias 106 formed in overlying alignment therewith, such that a matrix or "grid work" is defined in the dielectric material 104.

At 506, all of the first vias are filled with a conductive material and are polished flush with the first dielectric layer. For purposes of the present example, each of the vies 106 is filled with a conductive material 108. In one non-limiting example, each via 106 is filled with titanium (Ti). The respective portions (or volumes) of the conductive material 108 are then polished flush with the first dielectric layer 104 such that a planar surface 110 is defined.

At 508, a second dielectric layer is deposited. For purposes of the present example, a layer of dielectric material 112 is formed over the parallel conductors 102 and the base dielectric layer 100.

At 510, second vies are formed in the second dielectric layer by way of photolithography and etching. For purposes of the present example, the same photolithographic mask as used in step 504 above is used to define locations for a plurality of respective vias 114 in the layer of dielectric material 112. The vies 114 are then defined by etching. Each of the vies 114 is located in overlying alignment with a corresponding portion of the conductive material 108.

At 512, a portion of the conductive material in each of the first vies is reacted by way of the second vies. For purposes of the present example, a reactive fluid including at least one reactive species is introduced into each of the vies 114. In one non-limiting example, the fluid F1 is or includes oxygen ($O_2$). The fluid F1 reacts with a fraction (but not the entirety) of each portion of conductive material 108 such that a corresponding plurality of reacted portions 116 is defined.

At 514, all of the second vias are filled with a conductive material and is polished flush with the second dielectric layer. For purposes of the present example, each of the vias 114 is filled with a conductive material 118. In one non-limiting example, each via 114 is filled with titanium (Ti). The respective quantities of conductive material 118 are then polished flush with the second dielectric layer 112 such that a planar surface 120 is defined.

At 516, parallel conductors are formed over the second dielectric layer. For purposes of a present example, distinct parallel conductors 122 are formed from copper over the second dielectric material 112. A plurality of distinct memristors 124 are thus defined, each including a portion of conductive material 108 and a reacted portion 116 and a portion of conductive material 118.

Each memristor 124 is in electrically conductive contact with a conductor 102 (lower) and a conductor 122 (upper). Each memristor 124 is formed or disposed at an intersection defined by a particular conductor 102 and a particular conductor 122 such that each memristor 124 can be individually accessed (i.e., read or adjusted).

The method above is described as a discrete steps occurring in a sequential order, in the interest of clarity. However, one having ordinary skill in the semiconductor fabrication or related arts will appreciate that at least some of the processes or operational steps of the present teachings can occur contemporaneously or essentially so.

In general and without limitation, the present teachings contemplate memristors and methods of theft fabrication. One or more electrically conductive pathways or buss-bars are defined within a base dielectric material by way of a damascene or other suitable process. The conductive pathways and base dielectric material are polished flush to define a planar surface.

A first dielectric layer is formed or deposited over the conductive pathways and the base dielectric material. A single-mask photolithography and etching process is used to define a plurality of vias within the first dielectric layer, each via extending through the first dielectric layer to an underlying conductive pathway. A matrix or grid-like pattern of such vias can thus be defined. Conductive material is formed (deposited or grown) within each of the vias in the first dielectric layer such that a plurality of portions of conductive material are defined. The conductive material portions and the first dielectric layer are then polished to define a planar surface.

A second dielectric layer is then formed or deposited over the first dielectric layer and the filled vies. A photolithography and etching process is used to define a plurality of vias within the second dielectric layer using the same mask as used for the first dielectric layer. Each of the second vias is aligned with and extends to an underlying one of the filled vias in the first dielectric layer. A reactive fluid including one or more reactive species in introduced into the vias of the second dielectric layer such that a fraction of each portion of conductive material is reacted. Reacted portions are thus defined within the vias of the first dielectric layer.

Conductive material is then formed within each of the vias in the second dielectric layer, in electrically conductive contact with a respect one of the reacted portions. A plurality of memristors, each including two respective portions of conductive material and a reacted portion, are thus defined. The conductive material portions and the second dielectric layer are then polished to define a planar surface.

One or more electrically conductive pathways or buss-bars are defined over the second dielectric material. Each of the memristors is in electrically conductive contact with, and is individually addressable by way of, a corresponding pair of the conductive pathways. The non-volatile electrical resistance of each memristor can be adjusted (i.e., programmed, or changed) by appropriate electrical signaling. The non-vola-

What is claimed is:

1. A method, comprising:
   defining a first via in a first dielectric layer;
   forming a first conductive material within the first via;
   forming a second dielectric layer over the first dielectric layer;
   defining a second via in the second dielectric layer aligned within the first via and leading to the first conductive material, thereby exposing a portion of the first conductive material;
   reacting the exposed portion of the first conductive material with at least one fluid species by way of the second via thereby forming a reacted portion of the first conductive material; and
   forming a second conductive material within the second via in electrical contact with the reacted portion of the first conductive material, the second conductive material being selected from the group consisting of Tantalum (Ta), Tantalum Nitride (TaN$_x$), Tantalum Oxide (TaO$_x$), Titanium (Ti), Titanium Nitride (TiN$_x$), Titanium Oxide (TiO$_x$), Hafnium (Hf), Hafnium Nitride (HfN$_x$), Hafnium Oxide (HfO$_x$), Tungsten (W), Tungsten Nitride (WN$_x$), and Tungsten Oxide (WO$_x$);
   wherein the first conductive material, the reacted portion of the first conductive material, and the second conductive material define a memristor.

2. The method according to claim 1, further comprising:
   forming a first conductive pathway supported by a base dielectric layer;
   forming the first dielectric layer over the first conductive pathway and the base dielectric layer, the forming of the first conductive material being performed such that the first conductive material is thereafter in electrical contact with the first conductive pathway; and
   forming a second conductive pathway over the second dielectric layer and in electrical contact with the second conductive material.

3. The method according to claim 2, wherein the base dielectric layer overlies a complimentary metal-oxide semiconductor (CMOS) circuit.

4. The method according to claim 1, wherein the first conductive material is selected from the group consisting of Tantalum (Ta), Tantalum Nitride (TaN$_x$), Tantalum Oxide (TaO$_x$), Titanium (Ti), Titanium Nitride (TiN$_x$), Titanium Oxide (TiO$_x$), Hafnium (Hf), Hafnium Nitride (HfN$_x$), Hafnium Oxide (HfO$_x$), Tungsten (W), Tungsten Nitride (WN$_x$), and Tungsten Oxide (WO$_x$), wherein the at least one fluid species includes Oxygen (O$_x$), Nitrogen (N$_x$), Sulfur (S), Carbon (C), Boron (B), or Phosphorus (P), and wherein the second conductive material is in direct contact with the reacted portion of the first conductive material.

5. The method according to claim 1, wherein the at least one fluid species includes Oxygen (O$_x$), Nitrogen (N$_x$), Sulfur (S), Carbon (C), Boron (B), or Phosphorus (P).

6. The method according to claim 1, the first conductive material being different than the second conductive material.

7. The method according to claim 1, the first conductive material being the same as the second conductive material.

8. The method according to claim 1, wherein the defining of the first via in the first dielectric layer and the defining of the second via in the second dielectric layer are performed by way of a same photolithographic mask.

9. The method according to claim 1, wherein the second conductive material is in direct contact with the reacted portion of the first conductive material.

10. A device, comprising:
    a first conductive material formed within a first via of a first dielectric layer;
    a reacted portion of the first conductive material being defined by a reaction of a portion of the first conductive material with at least one fluid species; and
    a second conductive material formed within a second via of a second dielectric layer disposed over the first dielectric layer, the second conductive material being selected from the group consisting of Tantalum (Ta), Tantalum Nitride (TaN$_x$), Tantalum Oxide (TaO$_x$), Titanium (Ti), Titanium Nitride (TiN$_x$), Titanium Oxide (TiO$_x$), Hafnium (Hf), Hafnium Nitride (HfN$_x$), Hafnium Oxide (HfO$_x$), Tungsten (W), Tungsten Nitride (WN$_x$), and Tungsten Oxide (WO$_x$), and the second conductive material in contact with the reacted portion, the first conductive material and the reacted portion and the second conductive material defining a memristor characterized by a non-volatile electrical resistance.

11. The device according to claim 10, further comprising a controller configured to adjust the non-volatile electrical resistance to one or more values within a range.

12. The device according to claim 11, further comprising a common substrate, wherein the memristor and the controller being supported by the common substrate.

13. The device according to claim 11, the controller further configured to sense a present value of the non-volatile electrical resistance.

14. The device according to claim 13, the controller further configured to perform the sensing while preserving the present value of the non-volatile electrical resistance within a tolerance range.

15. The device according to claim 10, wherein the first conductive material is selected from the group consisting of Tantalum (Ta), Tantalum Nitride (TaN$_x$), Tantalum Oxide (TaO$_x$), Titanium (Ti), Titanium Nitride (TiN$_x$), Titanium Oxide (TiO$_x$), Hafnium (Hf), Hafnium Nitride (HfN$_x$), Hafnium Oxide (HfO$_x$), Tungsten (W), Tungsten Nitride (WN$_x$), and Tungsten Oxide (WO$_x$), and wherein the at least one fluid species includes Oxygen (O$_x$), Nitrogen (N$_x$), Sulfur (S), Carbon (C), Boron (B), or Phosphorus (P).

* * * * *